United States Patent
Tsao et al.

(10) Patent No.: US 7,583,502 B2
(45) Date of Patent: Sep. 1, 2009

(54) METHOD AND APPARATUS FOR INCREASING HEAT DISSIPATION OF HIGH PERFORMANCE INTEGRATED CIRCUITS (IC)

(75) Inventors: Pei-Haw Tsao, Tai-chung (TW); Hsin-Yu Pan, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 79 days.

(21) Appl. No.: 11/423,745

(22) Filed: Jun. 13, 2006

(65) Prior Publication Data

US 2007/0285890 A1    Dec. 13, 2007

(51) Int. Cl.
 *H05K 7/20* (2006.01)
(52) U.S. Cl. ............ 361/697; 165/80.3; 165/121; 165/185
(58) Field of Classification Search ......... 361/697, 361/700, 703, 704; 165/10, 80.3, 104.33, 165/121, 185; 257/E23.099, 715, 712, 721; 29/890.032; 174/15.2, 16.3
See application file for complete search history.

(56) References Cited

U.S. PATENT DOCUMENTS

| | | | |
|---|---|---|---|
| 5,522,700 A | 6/1996 | Hong | |
| 5,604,665 A * | 2/1997 | Chrysler et al. | 361/703 |
| 5,763,950 A * | 6/1998 | Fujisaki et al. | 257/712 |
| 5,785,116 A * | 7/1998 | Wagner | 165/80.3 |
| 5,794,685 A * | 8/1998 | Dean | 165/121 |
| 5,860,472 A * | 1/1999 | Batchelder | 165/185 |
| 5,884,691 A * | 3/1999 | Batchelder | 165/80.3 |
| 6,019,165 A * | 2/2000 | Batchelder | 165/80.3 |
| 6,023,413 A * | 2/2000 | Umezawa | 361/697 |
| 6,196,300 B1 * | 3/2001 | Checchetti | 165/80.3 |
| 6,269,866 B1 * | 8/2001 | Yamamoto et al. | 165/104.26 |
| 6,301,779 B1 * | 10/2001 | Azar | 29/890.03 |
| 6,550,531 B1 * | 4/2003 | Searls et al. | 165/104.33 |
| 6,575,231 B1 * | 6/2003 | Wu | 165/121 |
| 6,650,544 B1 * | 11/2003 | Lai | 361/700 |
| 6,659,169 B1 * | 12/2003 | Lopatinsky et al. | 165/121 |
| 6,736,192 B2 * | 5/2004 | Chang | 165/80.3 |
| 6,747,873 B1 * | 6/2004 | Searls et al. | 361/695 |
| 6,820,684 B1 * | 11/2004 | Chu et al. | 165/104.33 |
| 6,883,592 B2 * | 4/2005 | Lee | 165/80.3 |

(Continued)

FOREIGN PATENT DOCUMENTS

TW    200501366 A    1/2005

OTHER PUBLICATIONS

Corresponding Taiwan 0503-A3228 Office Action issued Jun. 1, 2009.

*Primary Examiner*—Jayprakash N Gandhi
*Assistant Examiner*—Courtney Smith
(74) *Attorney, Agent, or Firm*—Duane Morris LLP

(57) ABSTRACT

A heat sink is presented for dissipating heat from an integrated circuit (IC). The heat sink is made of a heat conductive material having a generally planar shape and adapted to receive an IC chip on a bottom surface and adapted to be in thermal connection with the IC chip. The heat sink has a plurality of fins extending from and above a top surface of the heat sink and a plurality of slots providing fluid communication between the top surface and the bottom surface. The plurality of slots allow for air circulation below the heat sink and around the IC and other proximate components to increase heat dissipation.

17 Claims, 2 Drawing Sheets

U.S. PATENT DOCUMENTS

| | | | |
|---|---|---|---|
| 7,040,388 B1 * | 5/2006 | Sato et al. | 165/185 |
| 7,082,032 B1 * | 7/2006 | Barsun et al. | 361/703 |
| 7,150,312 B2 * | 12/2006 | Parish et al. | 165/104.21 |
| 2004/0000393 A1 * | 1/2004 | Tavassoli | 165/80.3 |
| 2004/0037036 A1 * | 2/2004 | Suzuki | 361/688 |
| 2005/0145366 A1 * | 7/2005 | Erel | 165/80.3 |
| 2006/0203450 A1 * | 9/2006 | Wei | 361/700 |
| 2007/0008702 A1 * | 1/2007 | Chang et al. | 361/704 |

\* cited by examiner

METHOD AND APPARATUS FOR INCREASING HEAT DISSIPATION OF HIGH PERFORMANCE INTEGRATED CIRCUITS (IC)

BACKGROUND

As IC wafer fabrication process technology advances from sub-micro to nanometer, the heat generated by IC increases greatly due to the increased number of transistor as well an increase in the device current leakage. Therefore, the package and system thermal performance becomes a concern for high performance products.

A typical prior art flip-chip BGA package 100 for a high performance IC 106 is shown in FIG. 1. The package has a heat sink 107 made of a material with a high coefficient of thermal conductivity and fan 109 to handle the IC power dissipation. The heat generated by the integrated circuit 106 is transferred to the heat sink 107 by conduction. The fan 109 creates an airflow to dissipate the heat from the heat sink 107 by convection. The fins 108 on the heat sink 107 maximize surface area contact with the air which advantageously increases conduction between the heat sink 107 and the air. The flow of the air is represented by arrows 120. However, as seen from the air flow 120 only the top side of the package is effectively for heat dissipation, due to the lack of air flow at the other areas of the IC 106 such as the side and bottom, substrate surface 103 and printed circuit board surface 101. Thus, the effects of the prior art heat sink are not maximized.

It is therefore an object of the present subject matter to obviate the deficiencies of the prior art and present a heat sink for an integrated circuit including a heat conductive material having a generally planar shape adapted to receive an IC chip on a bottom surface and adapted to be in thermal connection with the IC chip. The heat sink includes fins extending from and above a top surface of the heat sink; and a plurality of slots providing fluid communication between the top surface and the bottom surface of the heat sink.

It is also an object of the present subject matter to present an integrated circuit package including a substrate; a integrated circuit positioned on the substrate, and a heat sink in thermal connection with the IC chip. The heat sink includes a plurality of fins and a plurality of fluid passages between a top surface and a bottom surface of the heat sink. The integrated circuit package also includes a fan adapted to force fluid from the top surface to the bottom surface.

It is further an object to present a method to increase heat dissipation in a IC package, the package including a substrate; an integrated circuit positioned on the substrate, a heat sink in thermal connection with the IC chip and a heat sink comprising a plurality of fins. The method includes the step of forming a plurality of fluid passages between the top surface and a bottom surface of the heat sink.

These and many other objects and advantages of the present subject matter will be readily apparent to one skilled in the art to which the subject matter pertains from a perusal of the claims, the appended drawings and the following detailed description of the preferred embodiments.

DETAILED DESCRIPTION

Figure 1:
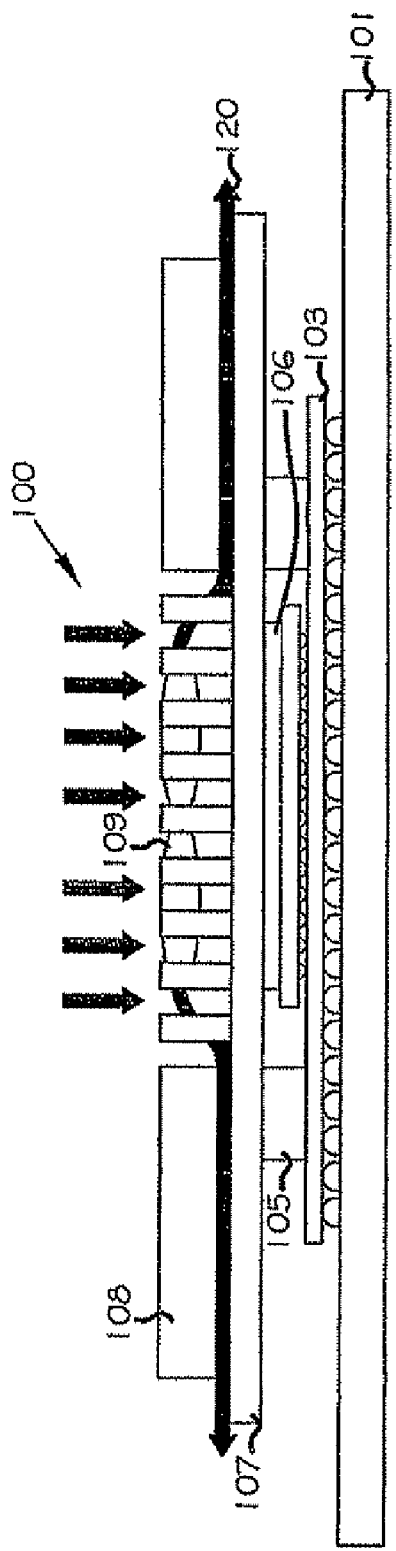
FIG. 1 is a IC package with a prior art heat sink.
Figure 2:
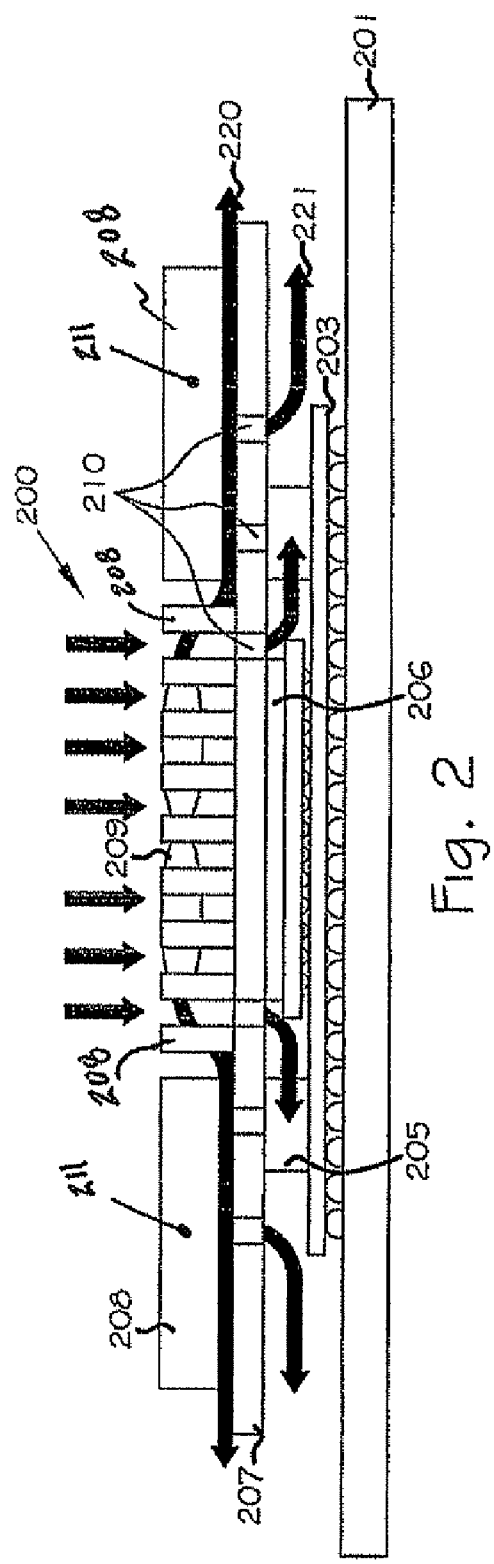
FIG. 2 is a representation of an IC package with a heat sink according to an embodiment of the present subject matter.

The heat sink of the present subject matter is shown in FIG. 2. The heat sink 207 has a plurality of ventilation holes 210 to allow air to pass through the heat sink. The holes and/or slots 210 can be formed by drilling, milling, etching or punching. The heat sink 207 with the ventilation holes 210 allow the cooling air from the fan 209 to flow not only over the top surface and fins 208, but also around all the areas of the IC chip 206, substrate 203 or printed circuit board 201. As seen in FIG. 2, the air flow 220 is produced through the fins 208 (i.e., through flow channels formed by adjacent side surface 211 of adjacent fins 208) on top of the heat sink 207 and under the heat sink 207. This flow will maximize the heat dissipation performance of the package 200, heat sink 207, substrate 203 and printed circuit board 201 for high performance IC packages by increasing the area exposed to the air flow. The system's thermal performance can be increased greater than 5% with minimum efforts and little change other than the addition of the holes or slot 210 in the heat sink 207.

Figure 3:
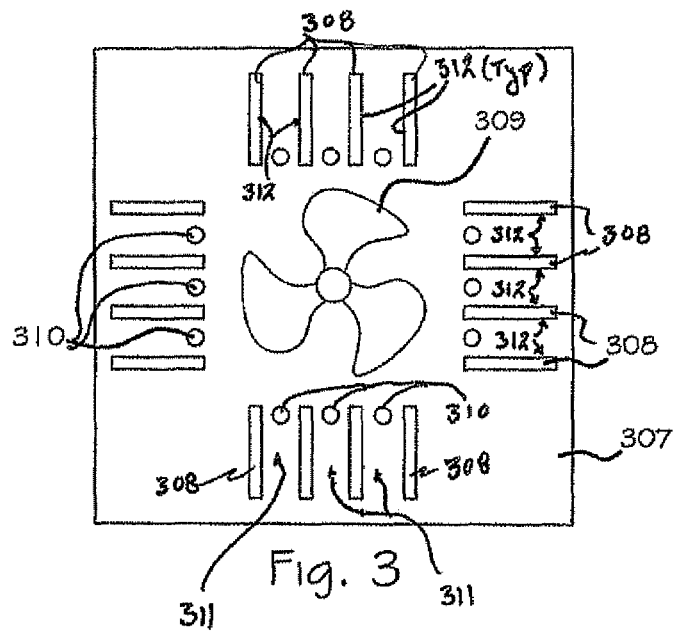
FIG. 3 is a representation of a heat sink also according to an embodiment of the present subject matter.

FIG. 3 is a top view of the heat sink of FIG. 2. The heat sink 307 has a plurality of fins 308 and a fan 309 centrally located, however this location is not required. Air flow produced through the fins 308 (i.e., through flow channels 311 formed by adjacent side surfaces 312 of adjacent fins 308). The slots 310 are formed around the periphery of the IC chip (not shown) in the heat sink 307 and, as shown, preferably between the fins 308.

Figure 4:
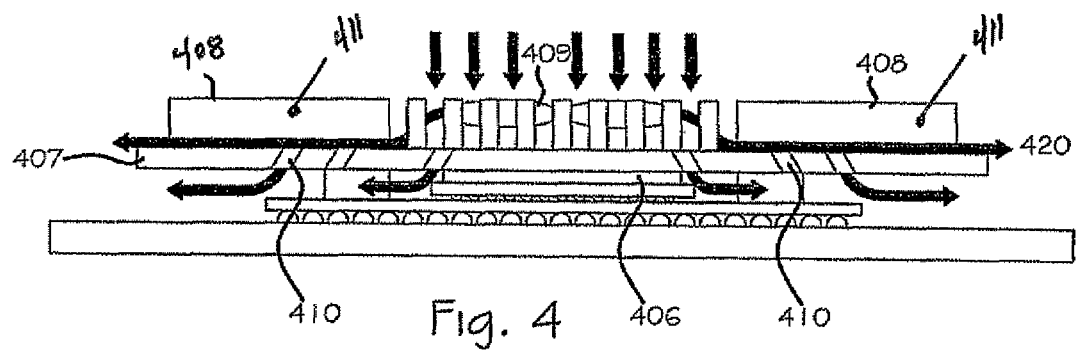
FIG. 4 is a representation of a heat sink according to another embodiment of the present subject matter.

FIG. 4 is a side view of the heat sink 407 and IC chip 406 according to another embodiment of the present subject matter. In FIG. 4, the slots 410 are slanted, or oblique with respect to the surfaces of the heat sink to increase flow from the top surface to the lower surface and extend downward and outward towards a periphery of the heat sink. The air flow 420 from fan 409 passes by the fins 408 (i.e., through flow channels formed by adjacent side surfaces 411 of adjacent fins 408) and also through the slots 410. Alternatively, the slots 410 may be formed oppositely to draw air up from underneath the heat sink 407, also creating air flow underneath the heat sink 407 and around the package components located under the heat sink 407.

Figure 5:
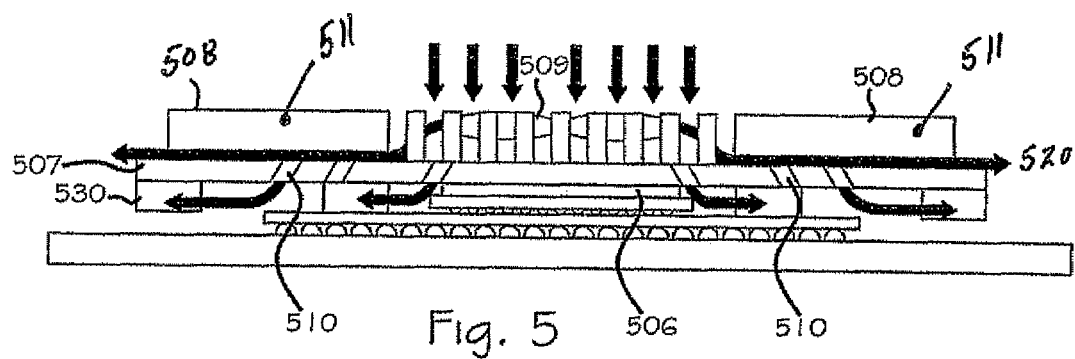
FIG. 5 is a representation of a heat sink according to a yet another embodiment of the present subject matter.

FIG. 5 is a side view of the heat sink 507 and IC chip 506 according to yet another embodiment of the present subject matter. As with the previous embodiments, the air flow 520 from fan 509 passes by the fins 508 (i.e., through flow channels formed by adjacent side surfaces 511 of adjacent fins 508) and also through the slots 510. The heat sink, in addition to or in lieu of the fins 508 located on the top surface of the heat sink as shown, may have fins 530 incorporated on the bottom side of the heat sink 507 around the periphery thereof as to not interfere with the IC or other package components. The fins 530 on the bottom, in addition to aiding heat dissipation for the heat sink 507 and thus IC, also may be used to control air flow around the package components underneath the heat sink 507.

While preferred embodiments of the present subject matter have be described, it is to be understood that the embodiments described are illustrative only and that the scope of the subject matter is to be defined solely by the appended claims when accorded a full range of equivalence, many variations and modifications naturally occurring to those of skill in the art from a perusal hereof.

What we claim is:

1. A heat sink for an integrated circuit comprising:
   a heat conductive material having a generally planar shape adapted to receive an IC chip on a bottom surface and adapted to be in thermal connection with the IC chip;
   a plurality of fins in contact with a top surface of the heat sink, each of the plurality of fins have a pair of sidewalls, the plurality of fins forming a plurality of flow channels defined by the side walls of adjacent ones of said plurality of fins;
   a plurality of slots within said heat sink, said plurality of slots providing fluid communication between the top surface and the bottom surface;
   wherein one end of each of the plurality of slots is disposed between adjacent ones of the plurality of fins, and
   wherein at least one of the plurality of slots is oblique to the top and bottom surfaces of the heat sink, and extends downward and outward towards a periphery of the heat sink.

2. The heat sink according to claim 1, further comprising a fan positioned to force a fluid through the flow channels and the plurality of slots.

3. The heat sink according the claim 1, wherein the plurality of slots are positioned between the plurality of fins.

4. The heat sink according to claim 1, wherein the heat sink comprises metal.

5. The heat sink according to claim 1, further comprising a second plurality of fins on the bottom surface of the heat sink.

6. An integrated circuit package comprising:
   a substrate;
   an integrated circuit (IC) chip positioned on the substrate, and
   a heat sink in thermal connection with the IC chip; the heat sink comprising a plurality of fins, each of the plurality of fins have a pair of sidewalls, the plurality of fins forming a plurality of flow channels defined by the side walls of adjacent ones of said plurality of fins, the heat sink further comprising a plurality of fluid passages between a top surface and a bottom surface of the heat sink, one end of each of the plurality of fluid passages being disposed between adjacent ones of the plurality of fins, wherein at least one of the plurality of fluid passages is oblique to the top and bottom surfaces of the heat sink, and extends downward and outward towards a periphery of the heat sink; and
   a fan adapted to force fluid through the fluid passages.

7. The integrated circuit package according the claim 6, wherein the plurality of fluid passages are positioned between the plurality of fins.

8. The integrated circuit package according to claim 6, wherein the heat sink comprises metal.

9. The integrated circuit package according to claim 6, further comprising a second plurality of fins on the bottom surface of the heat sink.

10. A method to increase heat dissipation in an IC package, comprising:
    providing an IC package including a substrate, and an integrated circuit positioned on the substrate;
    providing a heat sink in thermal connection with the integrated circuit, the heat sink comprising a plurality of fins, each of the plurality of fins have a pair of sidewalls, the plurality of fins forming a plurality of flow channels defined by the side walls of adjacent ones of said plurality of fins; and
    forming a plurality of fluid passages between a top surface of the heat sink and a bottom surface of the heat sink to thereby increase heat dissipation, wherein at least one of the plurality of fluid passages is oblique to the top and bottom surfaces of the heat sink, and extends downward and outward towards a periphery of the heat sink;
    wherein one end of each of the plurality of fluid passages is disposed between a pair of adjacent ones of the plurality of fins to enhance flow through and over the heat sink.

11. The method of claim 10, wherein the (IC) package further comprises a fan.

12. The method of claim 11, further comprising the step of forcing a fluid through the plurality of fluid passages.

13. The method of claim 12, wherein the fluid is air.

14. The method of claim 10, wherein the step of forming a plurality of fluid passages comprises drilling the fluid passages in the heat sink.

15. The method of claim 10, wherein the step of forming the plurality of fluid passages comprises etching the fluid passages in the heat sink.

16. The method of claim 10, wherein the step of forming the plurality of fluid passages comprises punching the fluid passages in the heat sink.

17. The method of claim 10, wherein the step of forming the plurality of fluid passages comprises milling the fluid passages in the heat sink.

* * * * *

UNITED STATES PATENT AND TRADEMARK OFFICE
CERTIFICATE OF CORRECTION

PATENT NO. : 7,583,502 B2  
APPLICATION NO. : 11/423745  
DATED : September 1, 2009  
INVENTOR(S) : Pei-Haw Tsao et al.

Page 1 of 1

It is certified that error appears in the above-identified patent and that said Letters Patent is hereby corrected as shown below:

Column 2, line 17, replace "surface" with -- surfaces --.

Column 3, Claim 3, line 23, after "according" delete "the" and insert -- to --.

Column 4, Claim 7, line 1, after "according" delete "the" and insert -- to --.

Signed and Sealed this  
First Day of February, 2011

David J. Kappos  
*Director of the United States Patent and Trademark Office*